United States Patent
Koo et al.

(10) Patent No.: US 7,518,699 B2
(45) Date of Patent: Apr. 14, 2009

(54) CASSETTE FOR CONTAINING LIQUID CRYSTAL DISPLAY DEVICE

(75) Inventors: Sung-Mo Koo, Gyeonggi-Do (KR); Heung-Sun Kim, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 299 days.

(21) Appl. No.: 11/477,792

(22) Filed: Jun. 30, 2006

(65) Prior Publication Data
US 2007/0159589 A1    Jul. 12, 2007

(30) Foreign Application Priority Data
Dec. 29, 2005    (KR)    ........................ 10-2005-0134584

(51) Int. Cl.
*G02F 1/13*       (2006.01)
*G02F 1/1333*     (2006.01)
*B65H 1/00*       (2006.01)

(52) U.S. Cl. .................. 349/158; 349/187; 414/222.01; 414/226.03; 414/226.05

(58) Field of Classification Search .................. None
See application file for complete search history.

(56) References Cited

U.S. PATENT DOCUMENTS

| | | | | |
|---|---|---|---|---|
| 2004/0001177 A1* | 1/2004 | Byun et al. | ................... | 349/187 |
| 2005/0073667 A1* | 4/2005 | An et al. | ........................ | 355/72 |
| 2005/0089388 A1* | 4/2005 | Park | ........................ | 414/222.01 |
| 2006/0182556 A1* | 8/2006 | Liu et al. | ................ | 414/331.01 |
| 2006/0245848 A1* | 11/2006 | Wang | ........................ | 414/217 |
| 2007/0020067 A1* | 1/2007 | Lin et al. | ................ | 414/331.09 |
| 2008/0003082 A1* | 1/2008 | Motoshima et al. | ........ | 414/217.1 |

FOREIGN PATENT DOCUMENTS

JP          2005015211 A    *    1/2005

* cited by examiner

*Primary Examiner*—Michelle R Connelly Cushwa
(74) *Attorney, Agent, or Firm*—McKenna Long & Aldridge LLP

(57)            ABSTRACT

A cassette for a liquid crystal display (LCD) device, comprises: a body for receiving a substrate on which a plurality of LC panels divided from one another by a dummy region are formed; a plurality of supporting bars rotatably installed in the body and having a predetermined shape, for supporting a substrate; and a plurality of pads formed on each surface of the supporting bar with a different gap therebetween and contacting the dummy region of the substrate. When LCD devices of various sizes are received in the cassette, supporting bars for supporting each of the LCD devices are prevented from contacting an image display region of the LCD device and thus an inferiority of the LCD device is prevented.

17 Claims, 5 Drawing Sheets

CASSETTE FOR CONTAINING LIQUID CRYSTAL DISPLAY DEVICE

This application claims the benefit of Korean Patent Application No. 10-2005-134584, filed Dec. 29, 2005, which is hereby incorporated by reference for all purposes as if fully set forth herein. This application incorporates by reference co-pending application, Ser. No. 10/184,096, filed on Jun. 28, 2002 entitled "SYSTEM AND METHOD FOR MANUFACTURING LIQUID CRYSTAL DISPLAY DEVICES FROM LARGE MOTHER SUBSTRATE PANELS"; and co-pending application, Ser. No. 11/476,919, filed on Jun. 29, 2006, entitled "METHODS OF MANUFACTURING LIQUID CRYSTAL DISPLAY DEVICES" for all purposes as if fully set forth herein.

BACKGROUND OF THE INVENTION

1. Field of the Invention

The present invention relates to a cassette for containing a liquid crystal display (LCD) device, and more particularly, to a cassette for an LCD device capable of preventing defects of the LCD device generated when an active region of a substrate contacts a supporting bar.

2. Discussion of the Background Art

Recently, various portable electric devices, such as mobile phones, personal digital assistant (PDA), and notebook computers have been developed having small sizes, light weights, and power-efficient operations. Accordingly, flat panel display devices, such as liquid crystal displays (LCDs), plasma display panels (PDPs), field emission displays (FEDs), and vacuum fluorescent displays (VFDs), have been developed. Of these flat panel display devices, LCDs are currently mass-produced because of their simple driving scheme and superior image quality.

FIG. 1 is a cross sectional view of an LCD device according to the related art. As shown in FIG. 1, an LCD device 1 includes a lower substrate 5, an upper substrate 3, and a liquid crystal layer 7 formed therebetween. The lower substrate 5 is a switching device array substrate, and includes a plurality of pixels (not shown) and a switching device, such as a thin film transistor (TFT), formed on each pixel. The upper substrate 3 is a color filter substrate and includes a color filter layer for displaying colors. In addition, a pixel electrode and a common electrode are formed on the lower substrate 5 and the upper substrate 3, respectively. An alignment layer is formed on both the lower and upper substrates 5 and 3 to align liquid crystal molecules of the liquid crystal layer 7.

The lower substrate 5 and the upper substrate 3 are attached along a perimeter by a sealing material 9, and a liquid crystal layer 7 is confined within the perimeter. In addition, orientation of the liquid crystal molecules of the liquid crystal layer 7 is controlled through the switching device formed on the lower substrate 5 to control amounts of light transmitted through the liquid crystal layer 7 to display an image.

FIG. 2 is a flow chart of a fabrication method for an LCD device according to the related art. As shown in FIG. 2, a fabrication method includes three sub-processes for manufacturing an LCD device: a switching device array substrate process for forming the driving device on the lower substrate 5; a color filter substrate process for forming the color filter on the upper substrate 3; and a cell forming process.

In Step S101, a plurality of gate lines and data lines are formed on the lower substrate 5 to define a pixel area in the switching device array process, and the thin film transistor connected to both the gate line and the data line is formed on the each pixel area. In addition, a pixel electrode connected to the thin film transistor to drive the liquid crystal layer according to a signal applied through the thin film transistor, is formed by the switching device array process.

In Step S104, R, G, and B color filter layers for reproducing the color and a common electrode are formed on the upper substrate 3 by the color filter process.

In Step S102 and S105, alignment layers are formed on the lower substrate 5 and the upper substrate 3. Then, the alignment layers are individually rubbed to induce surface anchoring (i.e. a pretilt angle and alignment direction) for the liquid crystal molecules of the liquid crystal layer 7. In Step S103, spacers are dispersed onto the lower substrate 5 for maintaining a uniform cell gap between the lower and upper substrates 5 and 3. In Step S106, a sealing material is formed along outer portions of the upper substrate 3. In Step S107, the lower and upper substrates 5 and 3 pressed together to be bond the substrates 5 and 3.

The lower substrate 5 and the upper substrate 3 are both made from a glass substrate that includes a plurality of unit panel areas on which the switching devices and the color filter layer are formed. In Step S108, the bonded upper and lower glass substrates 5 and 3 are cut into unit panels. In Step S109, liquid crystal material is injected into the gap formed between the upper and lower substrates 5 and 3 of the unit panels through a liquid crystal injection hole. In Step S109, the filled unit panel is completed by sealing the liquid crystal injection hole. In Step S110, the filled and sealed unit panel is tested.

The above steps are each performed on respective processing lines. Accordingly, the substrates 3 and 5 that have undergone one process are transferred to a subsequent processing line by a conveyor or an auto guide vehicle. However, when an LCD device having a large area is being fabricated, a large substrate has to be transferred in a factory. Since conveyors are not well suited for transferring the large substrate, the auto guide vehicle is mainly used to transfer the large substrate to a processing line.

When using the auto guide vehicle, a plurality of substrates is received in a cassette thereby to be transferred. Unloading the substrate from a processing line, receiving the substrate in a cassette, and loading the received cassette onto a next processing line are performed by a robot.

FIG. 3 shows a cassette for an LCD device according to the related art in which substrates are received for transfer by an auto guide vehicle. As shown, the cassette 40 of the related art for receiving an LCD device comprises a main body 41, a supporting bar 42 formed in the body to receive a substrate 10, and a pad 44 formed at the supporting bar 42 to fix the substrate 10 by contacting the substrate 10. The supporting bars 42 are formed in the body 41 as a multiple layers thereby to receive a plurality of liquid crystal panels 3.

FIG. 4 is a plan view showing the interior of the cassette 40 of FIG. 3 in accordance with the related art, in which the substrate 10 is received on one layer in the cassette 40. As shown, a plurality of LCD panels 3 are formed on the substrate 10, and the LCD panels 3 are separated from each other with a certain distance by a dummy region. A plurality of supporting bars 42 for supporting the substrate 10 are formed in the body 41 (the same number of supporting bars 42 are formed at upper and lower portions of the body 41). That is, the substrate 10 is received in the cassette 40 by the plural supporting bars 42. The supporting bar 42 is provided with a plurality of pads 44. The pads 44 are formed of a material such as rubber able to absorb an impact and having an excellent coefficient of friction for fixing the substrate 10 and to prevent impact damage to the substrate 10. The pad 44 contacts the dummy region 4 of the substrate 10.

When the substrate 10 is received in the cassette 40, the cassette 40 is transferred to a next processing line by an auto guide vehicle and then unloaded from the cassette 40 by a robot or other means thereby to undergo a corresponding process.

However, the cassette of the related for an LCD device has the following problems.

As techniques for fabricating LCD device develop and the number of electronic devices employing LCD devices increases, LCD devices having various sizes are being fabricated. Methods for fabricating LCD devices having various sizes in one fabrication line are widely used. Accordingly, the size of an LCD panel formed on a substrate to be transferred from one processing line to another processing line is not always the same, but varies according to a model of a LCD device being fabricated.

FIG. 5 is a view showing a cassette 40 in which a substrate 10 has been received on which LCD panels 30 are formed each having a wider area than that of the LCD panels of FIG. 4. Since the LCD Panels shown in FIGS. 4 and 5 have different sizes from each other, a position on the substrate 10 where the LCD panel 3 is formed in FIG. 5 is different from a position of the LCD panel 3 on the substrate 10 in FIG. 4. A pad 44 is positioned at a dummy region 4 of the substrate 10 in FIG. 4. However, in FIG. 5, the pad 44 is positioned differently relative to the LCD panels 3.

When the substrate 10 is received in the cassette 40 of FIG. 4, a dummy region of the substrate 10 contacts the pad 4. As a result, even when the substrate 10 pressed, a defect is not generated. However, when the pad 4 is positioned within the LCD panel 3 as shown in FIG. 5, if the substrate 10 is pressed, the pad 44 presses on an area of the LCD panel 3 for displaying an image and a defect in the LCD device may result. The above problem occurs primarily at the time of transferring attached LCD panels that have been received in the cassette 40 to another processing line. As the LCD panel 3 is pressed against a pad, a stain is generated on the LCD device.

SUMMARY OF THE INVENTION

Accordingly, the present invention is directed to a cassette for containing liquid crystal display device that substantially obviates one or more of the problems due to limitations and disadvantages of the related art.

An advantage of the present invention is to provide a cassette for a liquid crystal display (LCD) device capable of containing an LCD device having LC panels of different sizes using a rotatable supporting bar for supporting a substrate and arranging pads on each surface of the supporting bar with a different gap therebetween.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a cassette for a liquid crystal display (LCD) device, includes: a body for receiving a substrate on which a plurality of LC panels are formed; a plurality of supporting bars rotatably installed in the body and having a predetermined shape on which a substrate is positioned; a plurality of pads formed on each surface of the supporting bar with a different gap therebetween and contacting a dummy region of the substrate; a rotation shaft connected to the supporting bars thereby rotating the supporting bars; and a supporting bar controlling member coupled to the rotation shaft thereby rotating the rotation shaft.

In another aspect of the present invention, a method of fabricating a liquid crystal display (LCD) device, the method includes: holding a first substrate of the LCD device and a second substrate of the LCD device in a cassette; removing the first substrate and the second substrate from the cassette; performing a switching device array process on the first substrate; performing a color filter substrate process on the second substrate; bonding the first and second substrate together; cutting the attached substrates into a plurality of unit LCD panels, wherein the cassette includes a body for receiving a substrate on which a plurality of LC panels divided from each other by a dummy region is formed; a plurality of supporting bars rotatably installed in the body and having a predetermined shape to support a substrate; and a plurality of pads formed on each surface of the supporting bar with a different gap therebetween to contact a dummy region of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Hereinafter, a cassette for an LCD device according to embodiments of the present invention will be explained in detail with reference to the attached drawings.

Figure 1:
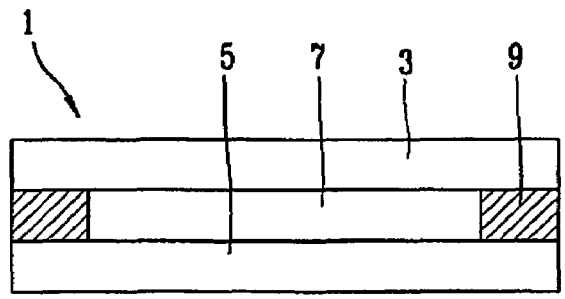
FIG. 1 is a sectional view showing a liquid crystal display (LCD) device in accordance with the related art.
Figure 2:
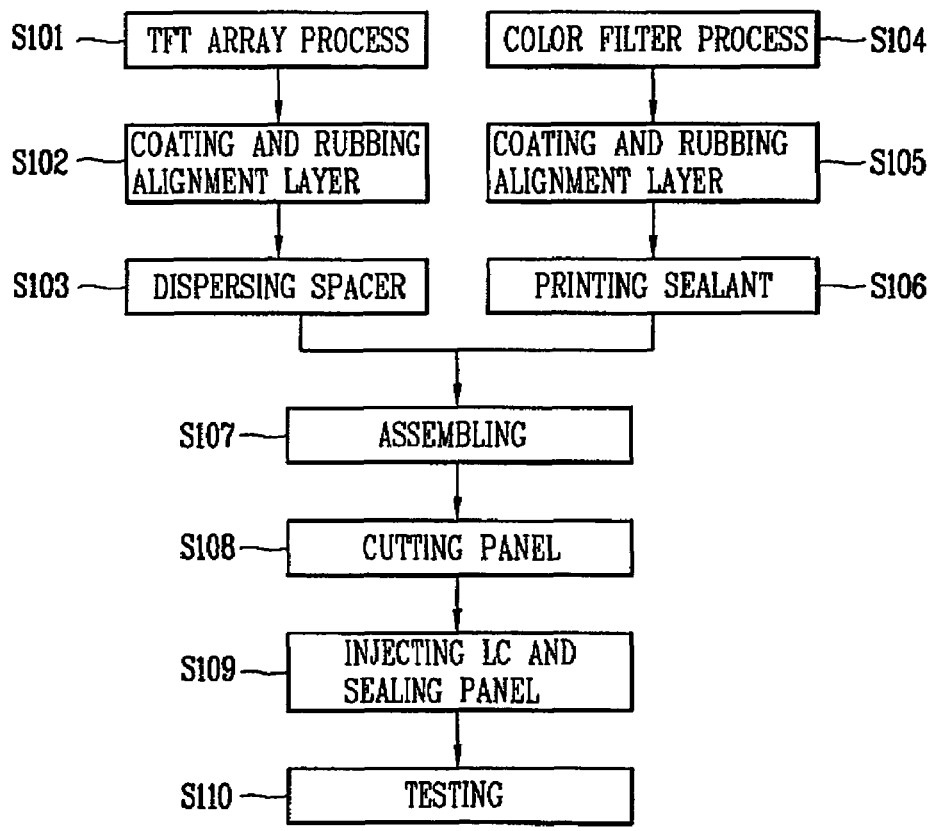
FIG. 2 is a flowchart showing a method for fabricating an LCD device in accordance with the related art.
Figure 3:
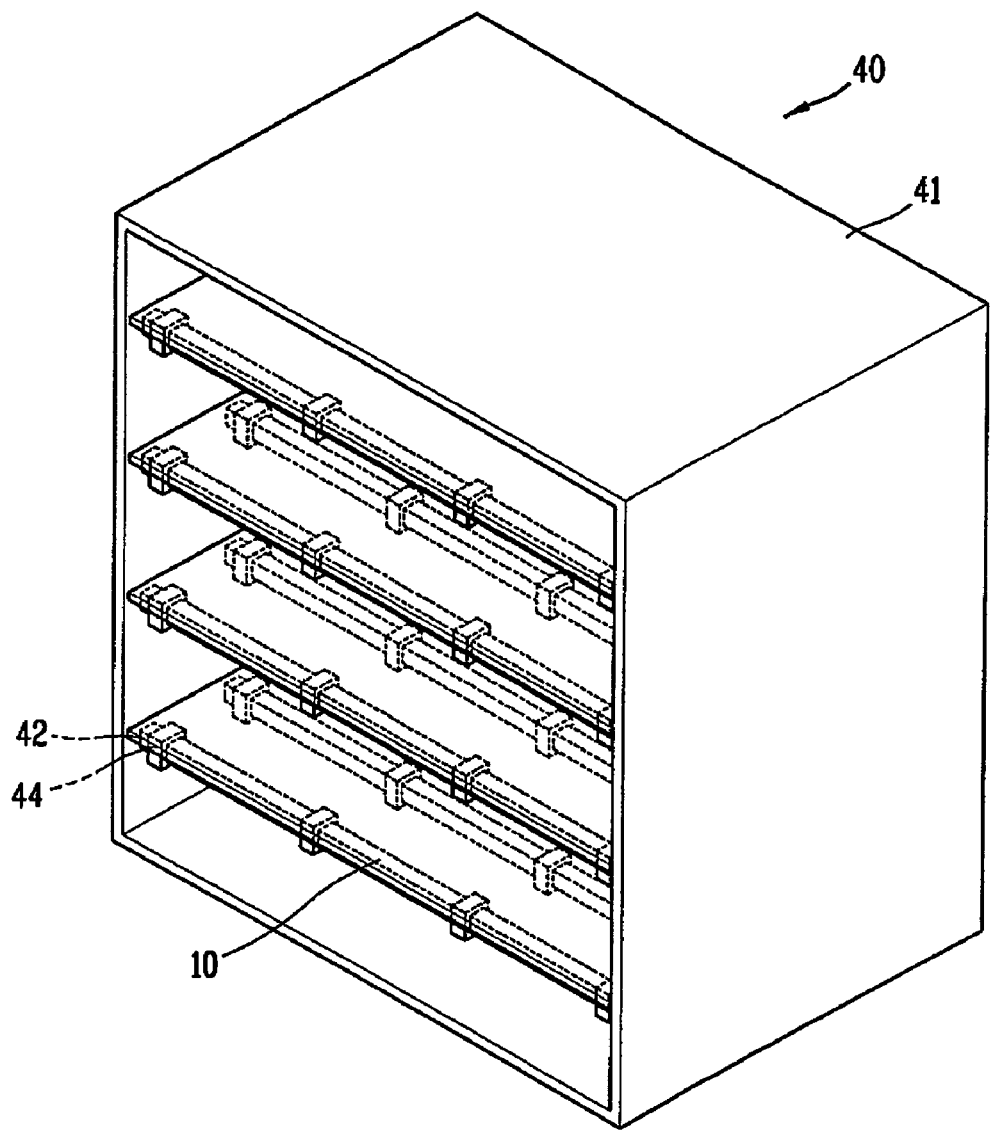
FIG. 3 is a perspective view showing a cassette for an LCD device in accordance with the related art.
Figure 4:
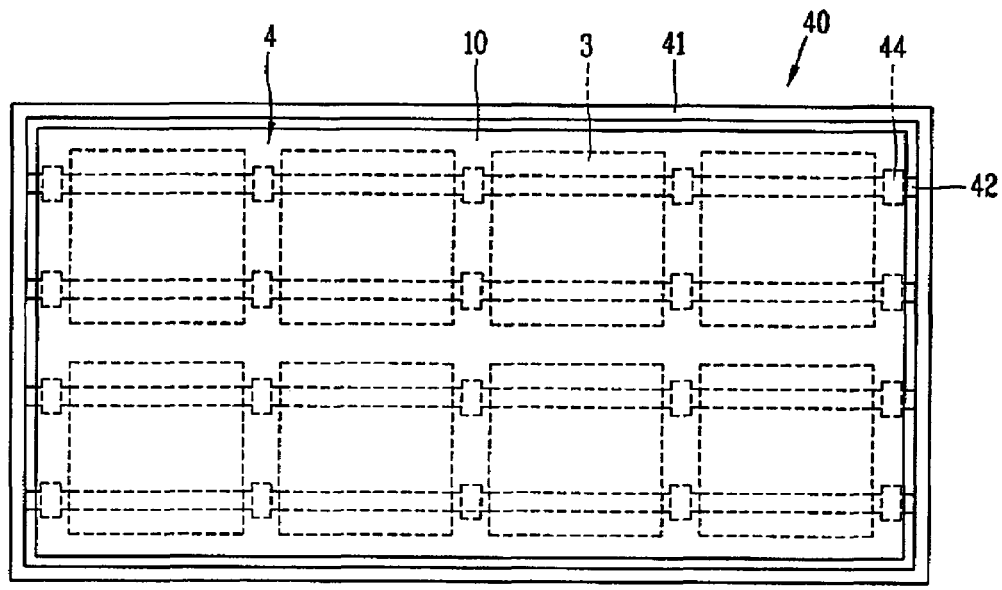
FIG. 4 is a plane view showing an inner structure of the cassette for an LCD device in accordance with the related art.
Figure 5:
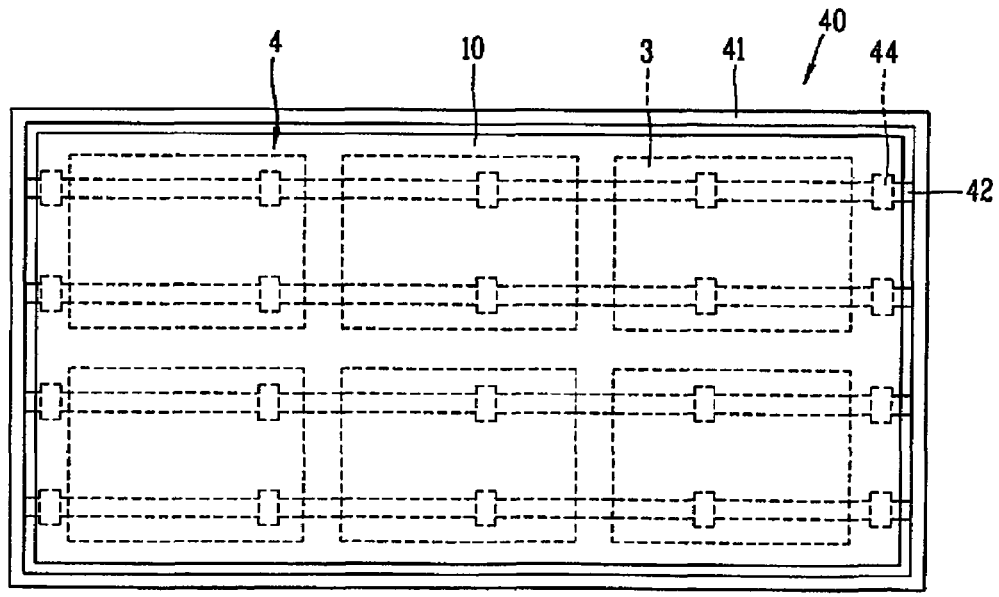
FIG. 5 is a plane view showing an inner structure of the cassette, in which a substrate having a different size from a substrate of FIG. 4 has been received.
Figure 6:
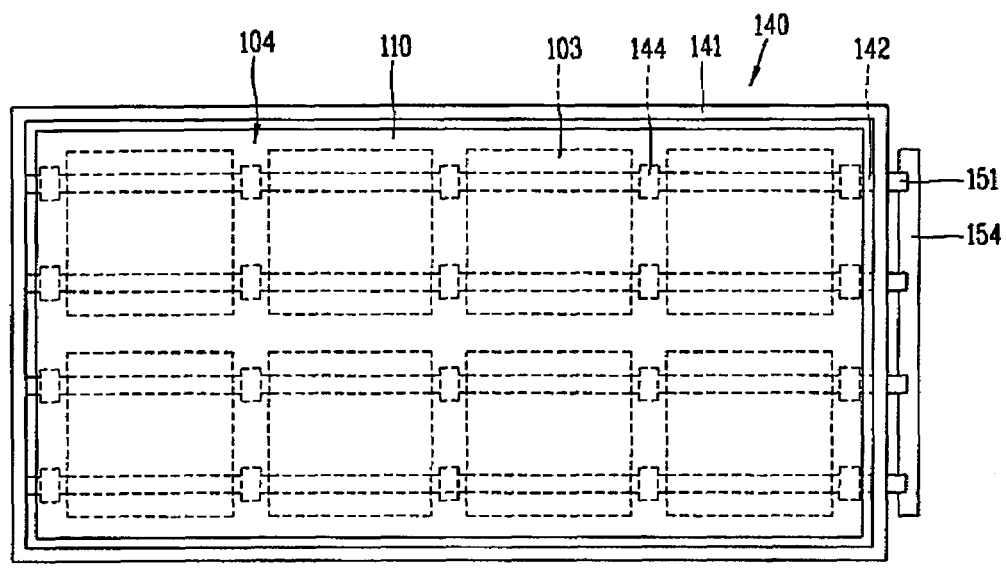
FIG. 6 is a plan view showing an inner structure of a cassette for an LCD device according to an embodiment of the present invention.

As shown in FIG. 6, the cassette 140 according to an embodiment of the present invention comprises a body 141; a plurality of supporting bars 142 formed in the body and on which a substrate 110 having a plurality of LCD panels 103 are formed is positioned; a pad 144 formed at the supporting bar 142 and fixing the substrate 110 by contacting the substrate 110; a rotation shaft 151 connected to the supporting bar 142 for rotating the supporting bar 142; and a supporting bar controlling member 154 coupled to the rotation shaft 151 for rotating the supporting bar 142 by applying a driving force to the rotation shaft 151.

The cassette 140 may receive a plurality of substrates 110 on the supporting bars 142 formed in multiple layers. In addition, the cassette 140 can receive a plurality of substrates, 110 on a supporting bar 142 of a single layer. In the illustrated embodiment, four supporting bars 142 are formed in the body 141 thereby to receive the substrate 110. However, it is also possible that 3 or fewer or 5 or more supporting bars 142 are installed according to a size of the substrate 110 thereby to receive the substrate 110.

The rotation shaft 151 for rotating the supporting bar 142 is connected to the supporting bar controlling member 154 and is rotated by adjusting the supporting bar controlling member 154.

Figure 7A:
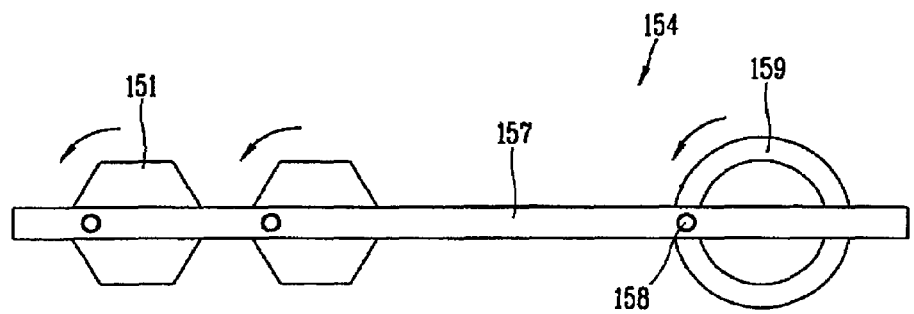
FIGS. 7A and 7B are views schematically illustrating supporting bar controlling members according to embodiments of the present invention.

FIG. 7A shows a supporting bar controlling member for rotating the supporting bar. The supporting bar controlling member 154 comprises a rotation shaft 151 connected to the supporting bar 142 to rotate the supporting bar 142; a controlling bar 157 rotatably coupled to the rotation shaft 151 by a fixing member and applying a rotation force to the rotation shaft 151; a protrusion 158 formed at the controlling bar 157; and a guide groove 159 for inserting the protrusion 158 and guiding it. In illustrated embodiment, the rotation shaft 151 has a hexagonal shape. However, the shape of the rotation shaft 151 may correspond to the shape of the supporting bar 142. The supporting bar controlling member 154 converts a linear motion of the controlling bar 157 into a rotary motion of the rotation shaft 151. That is, as the protrusion 158 of the controlling bar 157 is moved along the guide groove 159, the controlling bar 157 performs a crank motion. As a force generated from the crank motion is transmitted to the rotation shaft 151, the rotation shaft 151 is rotated. As the rotation shaft 151 is rotated, the supporting bar 142 connected to the rotation shaft 151 is rotated.

A plurality of stops such as fixing grooves for fixing the protrusion 158 may be formed at the guide groove 159 to thereby fix the rotation shaft 151 after rotation by certain mode-set angles. Herein, a rotation angle of the rotation shaft 151, that is, an angular distance that the protrusion 158 is moved in the guide groove 159, varies according to the shape of the supporting bar 142.

Figure 7B:
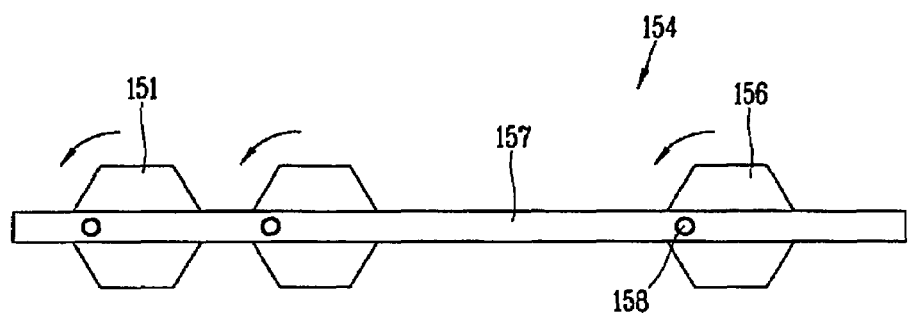

FIG. 7B is a view showing the supporting bar controlling member 154 for rotating the supporting bar 142 according to another embodiment of the present invention. FIG. 7B shows a similar structure as the structure shown in FIG. 7A, in which a rotation member 156 having a similar shape as the rotation shaft 151 connected to the supporting bar 142 can be installed in lieu of the guide groove 159. As the rotation member 156 is rotated, the controlling bar 157 is rotated and thus the rotation shaft 151 and the supporting bar 142 connected to the rotation shaft 151 are rotated.

FIGS. 7A and 7B show only two rotation shafts 151. However, the number of the rotation shafts 151 may correspond to the number of the supporting bars 142 formed on a support layer of the cassette 140. As the plurality of rotation shafts 151 is coupled to the controlling bar 157 and the controlling bar 157 performs a crank motion, the supporting bars 142 on the same layer are rotated by a mode-set angle.

As the upper and lower rotation shafts 151 are rotated, the supporting bars 142 arranged on a plurality of layers in the cassette 140 may simultaneously or individually rotated by a driving unit. That is, the supporting bars 142 on multiple layers formed in the cassette 140 can be rotated simultaneously by operating the supporting bar controlling member 154 coupled to the rotation shaft 151. Alternatively, the rotation shafts 151 formed on each layer can be individually rotated. The rotation shaft 151 can be directly rotated by a user.

Figure 8:
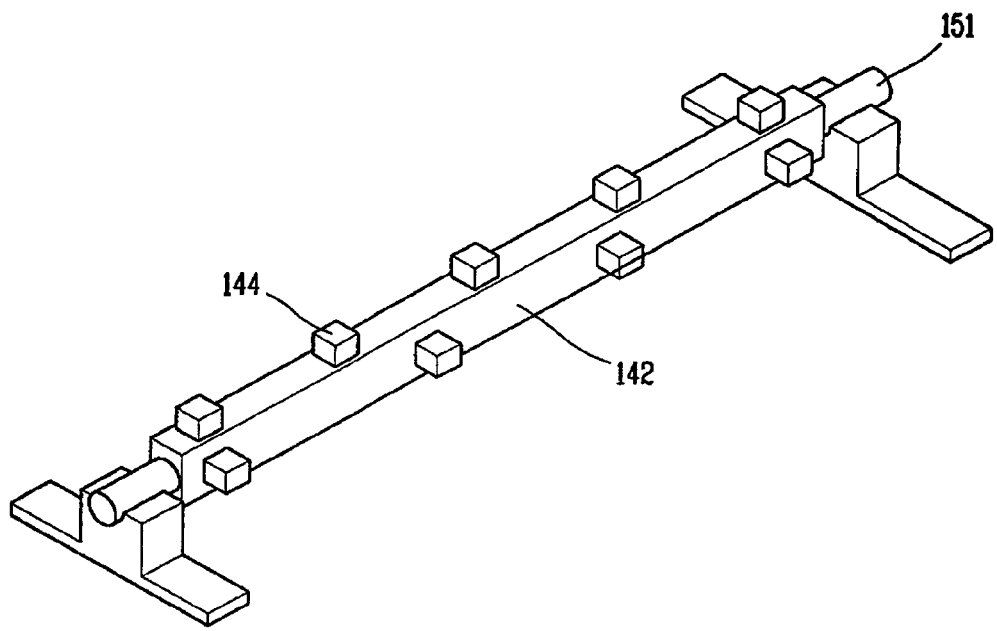
FIG. 8 is a perspective view showing a structure of a supporting bar according to an embodiment of the present invention.

Referring to FIG. 8, the pads 144 are illustrated as being formed on only two surfaces of the rectangular supporting bar 142. However, the pads 144 may be formed on all four surfaces of the supporting bar 142. A gap between the pads 144 formed on one surface of the supporting bar 142 differs from a gap between the pads 144 formed on another surface of the supporting bar 142. A position of the pads 144 corresponds to a dummy region 104 of the substrate 110 for a particular size of LCD panel. A separation distance between the pads 144 corresponds to a dimension of a particular LCD panel 103 formed on the substrate 110 received and received by a corresponding supporting bar 142 allowing the LCD panels 103 formed on the substrate 110 to be varied.

In the embodiment of the present invention shown in FIG. 8, each gap between the pads 144 on four surfaces of the supporting bar 142 is different from one another. Therefore, a substrate 110 having the LCD panels 103 of at least four different sizes can be received.

Figure 9:
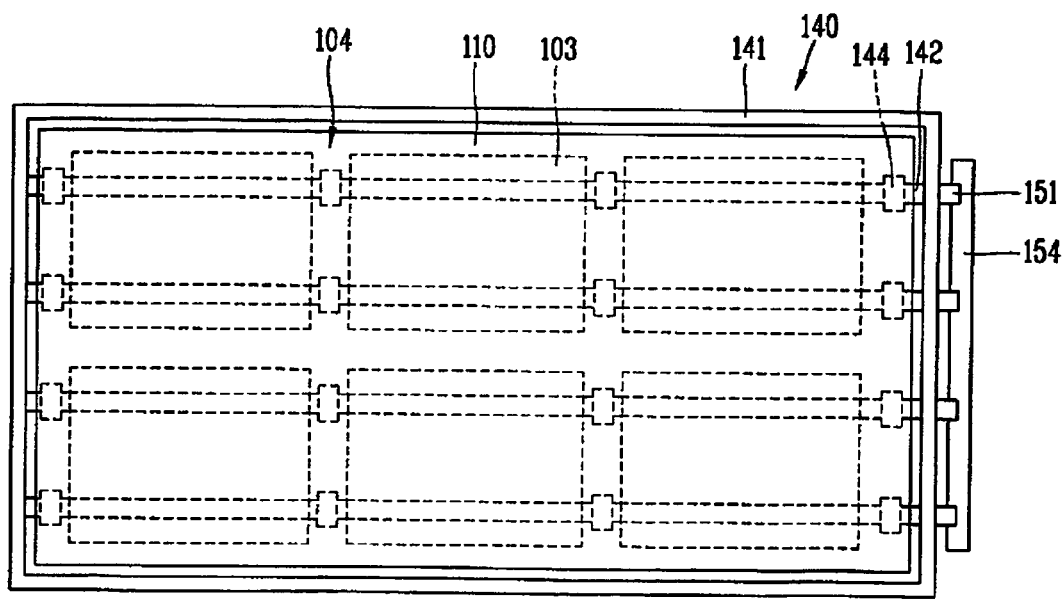
FIG. 9 is a plan view showing an inner structure of the cassette, in which a substrate having a different size from a substrate of FIG. 6 has been received according to an embodiment of the present invention.

FIG. 9 shows a cassette 140 in which a substrate 110 having LCD panels 103 of a different area from the LCD panels of FIG. 6 is received. A gap between the pads 144 formed on the supporting bar 142 for supporting the substrate 101 shown in FIG. 9 is wider than a gap between the pads 144 shown in FIG. 6. That is, the gap between the pads 144 of FIG. 9 has been increased by rotating the supporting bar 142 using the rotation shaft 151. Herein, the gap between the pads 144 is selected to correspond to the area of the LCD panel 103 formed on the substrate 110 so that the pad 144 can be positioned at the dummy region 104 of the substrate 110 between the LCD panels 103.

The pads 144 having a gap therebetween corresponding to the area of the particular LCD panel formed on the substrate 110 may be brought into contact with the substrate 110 by rotating the supporting bar 142 by an angle according to the area of the substrate 110. Accordingly, pads 144 can be positioned at the dummy region 104 of the substrate 110. As the result, even when the substrate 110 having the LCD panels 103 of various sizes is received in the cassette the supporting bar 142 contacts the dummy region of the substrate 110 but does not contact an area of the LCD panel 103 for displaying an image. Therefore, defects in an LCD device caused when the image display region is pressed due to the weight of the substrate 110 can be prevented.

Receiving the substrate 110 includes rotating the supporting bar 142 to contact a surface of the supporting bar 142 on which the pads 144 are formed with a different gap therebetween to the substrate 110 may be performed on each of the multiple layers inside the cassette 140. Substrates 110 having LCD panels 103 of varying sizes can be received on a corresponding layer inside the cassette 140, with each substrate 110 contacting a corresponding surface of the supporting bar 142 to the substrate 110 by rotating the respective supporting bar for the layer 142 by a different angle. That is substrates 110 having LCD panels 103 of various sizes can be received in one cassette 140. The supporting bars 142 arranged on each layer of the cassette can be arranged to contact the dummy region of the substrates 110.

The supporting bar 142 can have various shapes such as a pentagonal shape, a circular shape, a hexagonal shape, or a triangular shape as well as a rectangular shape. When the supporting bar 142 has a pentagonal shape, five surfaces on which the pads 144 are formed with a different gap therebetween are implemented thereby to effectively receive the substrate 110 having the LCD panels 103 of five different sizes. When the supporting bar 142 has a hexagonal shape, six surfaces on which the pads 144 are formed with a different gap therebetween are implemented thereby to effectively receive the substrate 110 having the LCD panels 103 of six different sizes. It is also possible to use a supporting bar 142 having another polygonal shape. When the supporting bar 142 has a polygonal shape having surfaces more than four, the rotation shaft is to be rotated by an angle (mode set angle) less than 90° to vary the size of LCD panel to be accommodated. Moreover, when the supporting bar 142 has a circular shape, a rotation angle of the rotation shaft can be freely controlled.

As aforementioned, in embodiments of the present invention, the polygonal or circular supporting bar for supporting the substrate or the LCD panels is rotatably constructed and pads are positioned on each surface of the supporting bar with a different gap therebetween. The pads on a corresponding surface of the supporting bar having a gap therebetween corresponding to the size of the LCD panels formed on the substrate contact the substrate at dummy regions. As a result, a pressure against an image display region due to a contact with the supporting bar can be prevented, thereby preventing stains from being generated on the LCD device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A cassette for a liquid crystal display (LCD) device, comprising:
   a body for receiving a substrate on which a plurality of LC panels divided from each other by a dummy region is formed;
   a plurality of supporting bars rotatably installed in the body and having a predetermined shape to support a substrate, the supporting bar being polygonal bar having a plurality of surfaces; and
   a plurality of pads formed on each surface of the supporting bar, the gap between the pads in one surface being different from the gap between the gap in other surface,
   wherein the gaps between the pads corresponds to a dimension of the LCD panel formed on the substrate so that the supporting bar is rotated to control the gap between the pads in accordance with the dimension of the LCD panel.

2. The cassette for an LCD device of claim 1, wherein the substrate is a switching device array substrate or a color filter substrate.

3. The cassette for an LCD device of claim 1, wherein the substrate is an LCD panel having a switching device array substrate and a color filter substrate are attached to each other.

4. The cassette for an LCD device of claim 1, wherein the supporting bars are formed in a plurality in a plane.

5. The cassette for an LCD device of claim 1, wherein the supporting bar is formed in plurality on multiple layers to support a plurality of substrates.

6. The cassette for an LCD device of claim 1, wherein the supporting bars are rotatable by an operator.

7. The cassette for an LCD device of claim 1, further comprising:
   a plurality of rotation shafts, each rotation shaft of the plurality connected to one of the supporting bars to rotate the supporting bars; and
   a supporting bar controlling member coupled to the rotation shafts to rotate the rotation shafts.

8. The cassette for an LCD device of claim 7, wherein the supporting bar controlling member comprises a controlling bar coupled to the rotation shafts to perform a crank motion.

9. The cassette for an LCD device of claim 8, wherein the supporting bar controlling member further comprises:
   a protrusion formed at the controlling bar; and
   a guide groove to guide the protrusion to generate a crank motion of the controlling bar.

10. The cassette for an LCD device of claim 8, wherein the supporting bar controlling member is implemented as a rotation member rotatable to rotate the rotation shafts.

11. The cassette for an LCD device of claim 7, wherein the supporting bar controlling member is to individually drive the rotation shaft connected to the plurality of supporting bars, the supporting bars arranged in substantially the same plane.

12. The cassette for an LCD device of claim 7, wherein the supporting bar controlling member is to simultaneously drive the rotation shafts connected to the plurality of supporting bars arranged in substantially the same plane.

13. The cassette for an LCD device of claim 7, wherein the supporting bar controlling member individually drives the rotation shafts connected to the plurality of supporting bars, the supporting bars arranged on a layer of the plurality of layers.

14. The cassette for an LCD device of claim 7, wherein the supporting bar controlling member simultaneously drives the rotation shaft connected to the plurality supporting bars, the supporting bars arranged on a plurality of layers.

15. The cassette for an LCD device of claim 7, wherein the supporting bar controlling member simultaneously drives the rotation shafts connected to the plurality of supporting bars arranged in the cassette.

16. The cassette for an LCD device of claim 7, wherein the supporting bars each have a polygonal shape having more than three surfaces.

17. A method of fabricating a liquid crystal display (LCD) device, the method comprising:
   holding a first substrate of the LCD device and a second substrate of the LCD device in a cassette;
   removing the first substrate and the second substrate from the cassette;
   performing a switching device array process on the first substrate;
   performing a color filter substrate process on the second substrate;
   bonding the first and second substrate together;
   cutting the attached substrates into a plurality of unit LCD panels,
   wherein the cassette includes a body for receiving a substrate on which a plurality of LC panels divided from each other by a dummy region is formed; a plurality of supporting bars rotatably installed in the body and having a polygonal shape to support a substrate; and a plurality of pads formed on each surface of the supporting bar with a different gap therebetween to contact a dummy region of the substrate.

* * * * *